United States Patent
Kato et al.

(10) Patent No.: US 12,001,133 B2
(45) Date of Patent: Jun. 4, 2024

(54) REFLECTIVE MASK BLANK, REFLECTIVE MASK, METHOD OF MANUFACTURING REFLECTIVE MASK BLANK, AND METHOD OF MANUFACTURING REFLECTIVE MASK

(71) Applicant: AGC Inc., Tokyo (JP)

(72) Inventors: Takuma Kato, Tokyo (JP); Daijiro Akagi, Tokyo (JP); Takeshi Okato, Tokyo (JP); Ryusuke Oishi, Fukushima (JP); Yusuke Ono, Fukushima (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/382,356

(22) Filed: Oct. 20, 2023

(65) Prior Publication Data

US 2024/0045320 A1 Feb. 8, 2024

Related U.S. Application Data

(63) Continuation of application No. PCT/JP2023/012236, filed on Mar. 27, 2023.

(30) Foreign Application Priority Data

Apr. 1, 2022 (JP) ................ 2022-061684

(51) Int. Cl.
*G03F 1/24* (2012.01)
*G03F 1/48* (2012.01)
*G03F 1/52* (2012.01)
*G03F 1/54* (2012.01)
*G03F 1/78* (2012.01)
*G03F 1/80* (2012.01)

(52) U.S. Cl.
CPC ............. *G03F 1/24* (2013.01); *G03F 1/48* (2013.01); *G03F 1/52* (2013.01); *G03F 1/54* (2013.01); *G03F 1/78* (2013.01); *G03F 1/80* (2013.01)

(58) Field of Classification Search
CPC .................................... G03F 1/24; G03F 1/48
USPC ............................................................ 430/5
See application file for complete search history.

(56) References Cited

U.S. PATENT DOCUMENTS

| 2006/0237303 | A1 | 10/2006 | Hosoya et al. |
| 2012/0145534 | A1 | 6/2012 | Kageyama |
| 2021/0096456 | A1 | 4/2021 | Suzuki et al. |
| 2023/0072220 | A1 | 3/2023 | Nakagawa et al. |

FOREIGN PATENT DOCUMENTS

| JP | 2006-283053 | | 10/2006 |
| JP | 2012-129520 | | 7/2012 |
| JP | 2014-170931 | | 9/2014 |
| JP | 2015-073013 | | 4/2015 |
| JP | 2021-056502 | | 4/2021 |
| JP | 2021-128247 | A | 9/2021 |
| JP | 2021-184108 | | 12/2021 |

OTHER PUBLICATIONS

International Search Report issued in International Application No. PCT/JP2023/012236, dated Jun. 6, 2023, w/English Translation—reference 17—20 cited therein.

*Primary Examiner* — Christopher G Young
(74) *Attorney, Agent, or Firm* — Oblon, McClelland, Maier & Neustadt, L.L.P.

(57) ABSTRACT

A reflective mask blank includes a substrate; a multilayer reflective film that reflects EUV light; a protection film that protects the multilayer reflective film; and an absorption film that absorbs the EUV light, in this order. The protection film contains 50 at % or more of Rh. When a band-shaped gray scale image parallel to an interface between the protection film and the multilayer reflective film is obtained by imaging a cross section of the protection film with a transmission electron microscope (TEM) and a luminance profile of the gray scale image in a longitudinal direction of the gray scale image is created, a number of peaks of the luminance profile per 100 nm in the longitudinal direction of the gray scale image is 50 or more.

18 Claims, 7 Drawing Sheets

REFLECTIVE MASK BLANK, REFLECTIVE MASK, METHOD OF MANUFACTURING REFLECTIVE MASK BLANK, AND METHOD OF MANUFACTURING REFLECTIVE MASK

CROSS-REFERENCE TO RELATED APPLICATION

The present application is a continuation application of International Application No. PCT/JP2023/012236, filed Mar. 27, 2023, which claims priority to Japanese Patent Application No. 2022-061684 filed Apr. 1, 2022. The contents of these applications are incorporated herein by reference in their entirety.

BACKGROUND OF THE INVENTION

1. Field of the Invention

The present disclosure relates to a reflective mask blank, a reflective mask, a method of manufacturing a reflective mask blank, and a method of manufacturing a reflective mask.

2. Description of the Related Art

In recent years, with miniaturization of semiconductor devices, EUV lithography (EUVL), which is an exposure technique using extreme ultra-violet (EUV) light, has been developed. EUV light includes a soft X-ray and a vacuum ultraviolet ray, and particularly refers to light having a wavelength of about 0.2 nm to 100 nm. At the present, EUV light having a wavelength of about 13.5 nm is mainly studied.

In the EUVL, a reflective mask is used. The reflective mask has a substrate, such as a glass substrate, a multilayer reflective film that reflects EUV light, a protection film that protects the multilayer reflective film, and an absorption film that absorbs the EUV light, in this order. An opening pattern is formed in the absorption film. In the EUVL, an opening pattern of an absorption film is transferred to a target substrate, such as a semiconductor substrate. The transferring includes transferring a reduced opening pattern.

The protection film of Japanese Unexamined Patent Application Publication No. 2021-056502 contains Ru and further contains at least one additive material selected from Al, Y, Zr, Rh, and Hf. The content of the additive material is 5 at % or more and less than 50 at %. That is, the main component of the protection film of Japanese Unexamined Patent Application Publication No. 2021-056502 is Ru. Japanese Unexamined Patent Application Publication No. 2014-170931 also discloses a similar protection film.

SUMMARY OF THE INVENTION

Problems to be Solved by the Invention

The protection film protects the multilayer reflective film from an etching gas when an opening pattern is formed in the absorption film using the etching gas. As the etching gas, a halogen-based gas, an oxygen-based gas, or a mixed gas thereof has been studied.

When the main component of the protection film is Ru, the etching resistance of the protection film has been insufficient. In particular, when an oxygen-based gas (including a mixed gas) is used as the etching gas, the etching resistance of the protection film has been insufficient.

An aspect of the present disclosure provides a technique for improving etching resistance of the protection film.

Means for Solving the Problem

According to an aspect of the present disclosure, a reflective mask blank includes a substrate; a multilayer reflective film that reflects EUV light; a protection film that protects the multilayer reflective film; and an absorption film that absorbs the EUV light. The substrate, the multilayer reflective film, the protection film, and the absorption film are arranged in this order. The protection film contains 50 at % or more of Rh. When a band-shaped gray scale image parallel to an interface between the protection film and the multilayer reflective film is obtained by imaging a cross section of the protection film with a transmission electron microscope (TEM) and a luminance profile of the gray scale image in a longitudinal direction of the gray scale image is created, a number of peaks of the luminance profile per 100 nm in the longitudinal direction of the gray scale image is 50 or more.

Effects of the Invention

According to an aspect of the present disclosure, the etching resistance of the protection film can be improved by using Rh as the main component of the protection film and improving a denseness of the protection film.

BRIEF DESCRIPTION OF THE DRAWINGS

Other objects and further features of the present disclosure will be apparent from the following detailed description when read in conjunction with the accompanying drawings, in which.

DESCRIPTION OF THE EMBODIMENT

Figure 1:
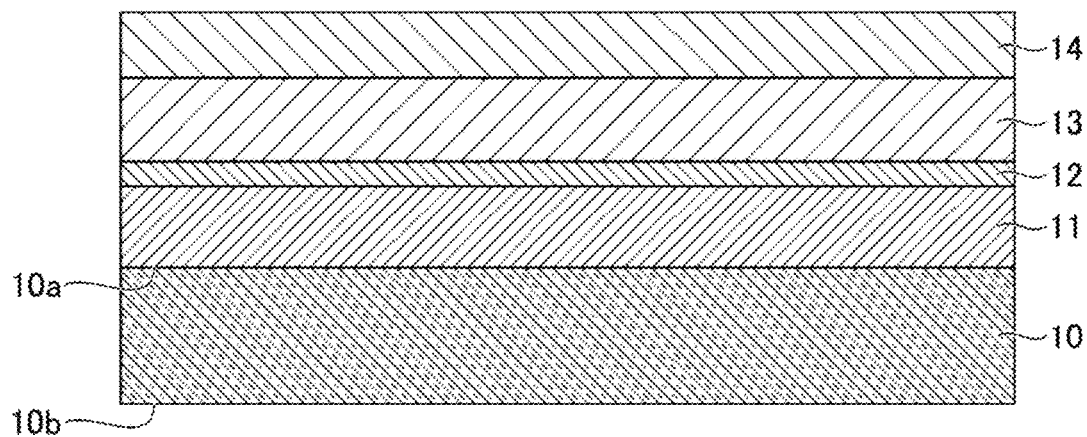
FIG. 1 is a cross sectional view showing a reflective mask blank according to an embodiment.
Figure 1:
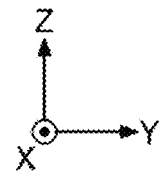

In the following, embodiments of the present disclosure will be described with reference to the accompanying drawings. In each drawing, to the same or corresponding configurations, the same reference numeral will be assigned, and an explanation may be omitted. In the specification, a symbol "-" or "to" representing a numerical range indicates that values before and after the symbol are included as a lower limit value and an upper limit value, respectively.

Figure 2:
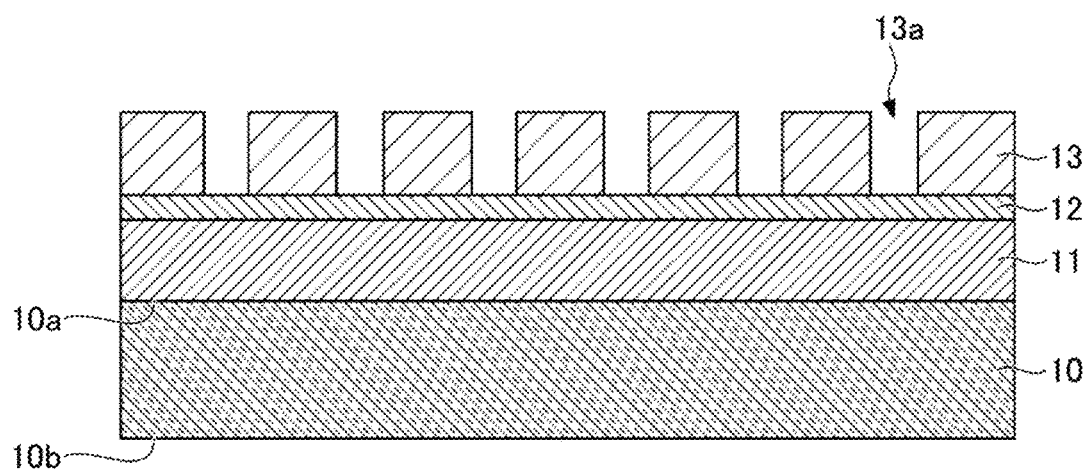
FIG. 2 is a cross sectional view showing a reflective mask according to the embodiment.
Figure 2:
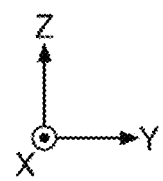
Figure 3:
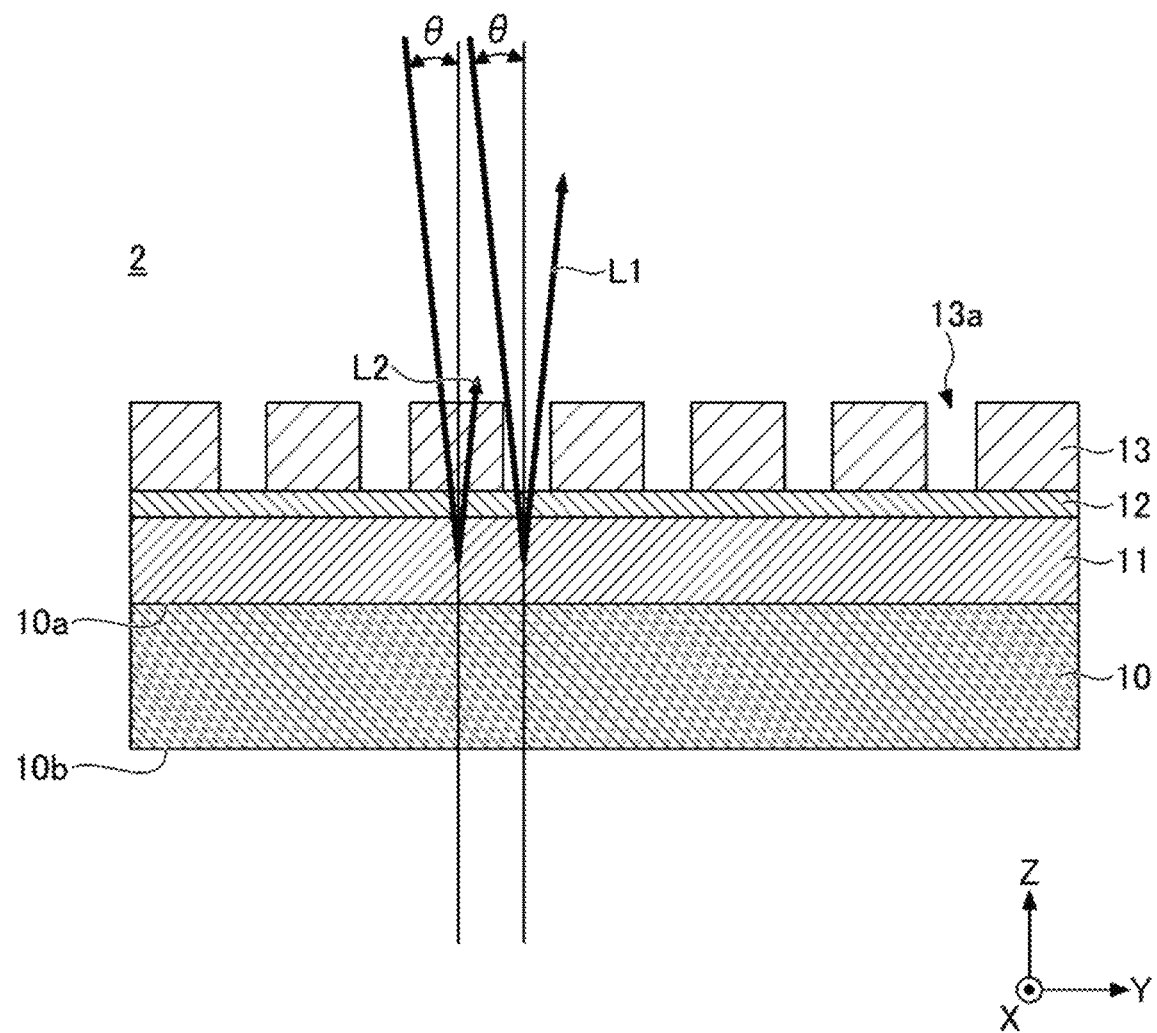
FIG. 3 is a cross sectional view of the reflective mask for illustrating an example of EUV light reflected by the reflective mask of FIG. 2.

In FIGS. 1 to 6, an X-axis direction, a Y-axis direction, and a Z-axis direction are directions orthogonal to each other. The Z-axis direction is a direction perpendicular to a first main surface 10a of a substrate 10. The X-axis direction is a direction orthogonal to an incident plane of EUV light (a plane including an incident light beam and a reflected light beam). As shown in FIG. 3, when viewed in the X-axis direction, the incident light beam is inclined towards the Y-axis positive direction on propagating in the Z-axis negative direction, and the reflected light beam is inclined towards the Y-axis positive direction on propagating in the Z-axis positive direction.

A reflective mask blank 1 according to an embodiment will be described with reference to FIG. 1. The reflective mask blank 1 includes, for example, a substrate 10; a multilayer reflective film 11; a protection film 12; an absorption film 13; and an etching mask film 14, in this order. The multilayer reflective film 11, the protection film 12, the absorption film 13, and the etching mask film 14 are formed in this order on the first main surface 10a of the substrate 10. The reflective mask blank 1 only needs to have at least the substrate 10, the multilayer reflective film 11, the protection film 12, and the absorption film 13.

The reflective mask blank 1 may further have a functional film (not shown in FIG. 1). For example, the reflective mask blank 1 may have a conductive film on the substrate 10 opposite to where the multilayer reflective film 11 is provided. The conductive film is formed on a second main surface 10b of the substrate 10. The second main surface 10b is a surface opposite to the first main surface 10a. The conductive film may be used, for example, to attract a reflective mask 2 to an electrostatic chuck of an exposure apparatus.

Although not shown, the reflective mask blank 1 may have a buffer film between the protection film 12 and the absorption film 13. The buffer film protects the protection film 12 from an etching gas for forming the opening pattern 13a in the absorption film 13. The buffer film is etched more moderately than the absorption film 13. Different from the protection film 12, the buffer film ultimately has the same opening pattern as the opening pattern 13a of the absorption film 13.

Next, the reflective mask 2 according to the embodiment will, be described with reference to FIGS. 2 and 3. The reflective mask 2 is manufactured using, for example, the reflective mask blank 1 shown in FIG. 1, and includes the opening pattern 13a in the absorption film 13. The etching mask film 14 shown in FIG. 1 is removed after the opening pattern 13a is formed in the absorption film 13.

In the EUVL, the opening pattern 13a of the absorption film 13 is transferred a target substrate such as a semiconductor substrate. The transferring includes transferring a reduced opening pattern. In the following, the substrate 10, the multilayer reflective film 11, the protection film 12, the absorption film 13, and the etching mask film 14 will be described in this order.

The substrate 10 is, for example, a glass substrate. A material of the substrate 10 is preferably quartz glass containing $TiO_2$. Compared with general soda lime glass, a linear expansion coefficient of the quartz glass is small, and thereby a dimensional change due to a temperature change is small. The quartz glass may contain 80 mass %-95 mass % of $SiO_2$ and 4 mass %-17 mass % of $TiO_2$. When the $TiO_2$ content is 4 mass %-17 mass %, the linear expansion coefficient around room temperature is substantially zero, and almost no dimensional change around room temperature occurs. The quartz glass may contain a third component or impurity other than $SiO_2$ and $TiO_2$. The material of the substrate 10 may be crystallized glass in which a β-quartz solid solution is precipitated, silicon, metal, or the like.

The substrate 10 has the first main surface 10a and the second main surface 10b opposite to the first main surface 10a. The multilayer reflective film 11 and the like are formed on the first main surface 10a. The size of the substrate 10 in a plan view (viewed in the Z-axis direction) is, for example, 1.52 mm longitudinally and 152 mm laterally. The longitudinal and lateral dimensions may be greater than or equal to 152 mm. Each of the first main surface 10a and the second main surface 10b has, for example, a square-shaped quality-guaranteed region at the center thereof. The size of the quality-guaranteed region is, for example, 142 mm longitudinally and 142 mm laterally. The quality-guaranteed region on the first main surface 10a preferably has a root mean square roughness (RMS) of 0.150 nm or less and a flatness of 100 nm or less. The quality-guaranteed region of the first main surface 10a is preferably free from a defect that may cause a phase defect.

The multilayer reflective film 11 reflects EUV light. The multilayer reflective film 11 is formed by alternately stacking, for example, a high refractive index layer and a low refractive index layer. A material of the high refractive index layer is, for example, silicon (Si), and a material of the low refractive index layer is, for example, molybdenum (Mo). With this combination, the multilayer reflective film is a Mo/Si multilayer reflective film. In addition, a Ru/Si multilayer reflective film, a Mo/Be multilayer reflective film, a Mo compound/Si compound multilayer reflective film, a Si/Mo/Ru multilayer reflective film, a Si/Mo/Ru/Mo multilayer reflective film, a Si/Ru/Mo/Ru multilayer reflective film, or the like can also be used as the multilayer reflective film 11.

The film thickness of each layer constituting the multilayer reflective film 11 and the number of repeating units of layers can be appropriately selected according to the material of each layer and a reflectance to EUV light. When the multilayer reflective film 11 is a Mo/Si multilayer reflective film, in order to achieve a reflectance of 60% or more with respect to EUV light having an incident angle θ (see FIG. 3) of 6°, a Mo film having a film thickness of 2.3±0.1 nm and a Si film having a film thickness of 4.5±0.1 nm may be stacked so that the number of repeating units is 30 or more and 60 or less. The multilayer reflective film 11 preferably has the reflectance of 60% or more to EUV light at an incident angle θ of 6°. The reflectance is more preferably 65% or more.

The method of forming each layer constituting the multilayer reflective film 11 is, for example, a DC sputtering method, a magnetron sputtering method, or an ion beam sputtering method. For example, film formation conditions for each of the Mo film and the Si film, when a Mo/Si multilayer reflective film is formed by the ion beam sputtering method, will be shown as follows.

<Film Formation Condition for Si Film>
  Target: Si;
  Sputtering gas: Ar;
  Gas pressure: 0.013 Pa-0.027 Pa;
  Ion acceleration voltage: 300 V-1500 V;
  Film formation rate: 0.030 nm/sec-0.300 nm/sec; and
  Film thickness of Si film: 4.5±0.1 nm.

<Film Formation Condition for Mo Film>
  Target: Mo;
  Sputtering gas: Ar;
  Gas pressure: 0.013 Pa-0.027 Pa;
  Ion acceleration voltage: 300 V-1500 V;

Film formation rate: 0.030 nm/sec-0.300 nm/sec; and
Film thickness of Mo film: 2.3±0.1 nm.

<Repeating Unit of Si Film and Mo Film>

Number of repeating units: 30-60 (preferably 40-50).

The protection film 12 is formed between the multilayer reflective film 11 and the absorption film 13, to protect the multilayer reflective film 11. The protection film 12 protects the multilayer reflective film 11 from an etching gas used for forming the opening pattern 13a (see FIG. 2) in the absorption film 13. The protection film 12 is not removed when the reflective mask 2 is manufactured, but rather remains on the multilayer reflective film 11.

The etching gas is, for example, a halogen-based gas, an oxygen-based gas, or a mixed gas thereof. The halogen-based gas includes a chlorine-based gas and a fluorine-based gas. The chlorine-based gas is, for example, a $Cl_2$ gas, a $SiCl_4$ gas, a $CHCl_3$ gas, a $CCl_4$ gas, a $BCl_3$ gas, or a mixture thereof. The fluorine-based gas is, for example, a $CF_4$ gas, a $CHF_3$ gas, a $SF_6$ gas, a $BF_3$ gas, a $XeF_2$ gas, or a mixture gas thereof. The oxygen-based gas is $O_2$ gas, $O_3$ gas, or a mixture gas thereof. The oxygen-based gas is suitably used when the main component of the absorption film 13 is ruthenium (Ru).

A ratio (ER1/ER2) of an etching rate ER1 of etching the absorption film 13 by the etching gas to an etching rate ER2 of etching the protection film 12 by the etching gas is also referred to as a selection ratio. The higher the selection ratio is, the better the processability of the absorption film 13 is. The selection ratio is preferably 10 or more, more preferably 30 or more. The selection ratio is preferably 200 or less, more preferably 100 or less.

Figure 4:
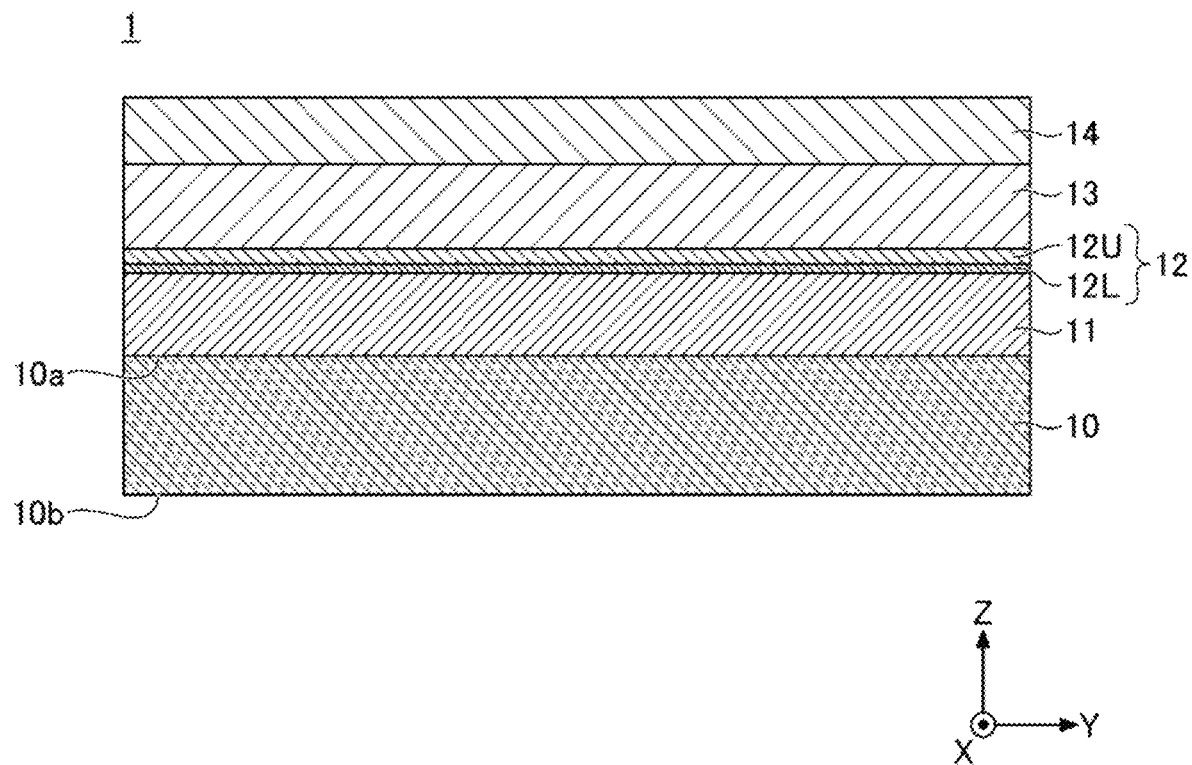
FIG. 4 is a cross sectional view showing a reflective mask blank according to a variation.

The protection film 12 contains 50 at % or more and 100 at % or less of Rh. The protection film 12 is preferably composed of a single layer as shown in FIG. 1 or the like from the viewpoint of productivity, but may be composed of a plurality of layers as shown in FIG. 4 from the viewpoint of multifunctionality. For example, the protection film 12 may have a lower layer 12L and an upper layer 12U. The lower layer 12L and the upper layer 12U are formed in this order on the multilayer reflective film 11. In any case, the protection film 12 only needs to contain 50 at % or more of Rh as a whole.

The protection film 12 contains Rh as a main component. By using Rh instead of Ru as the main component of the protection film 12, the etching resistance of the protection film 12 can be improved. In particular, when an oxygen-based gas (including a mixed gas) is used as the etching gas, the etching resistance of the protection film 12 can be improved.

In addition, by using Rh instead of Ru as the main component of the protection film 12, resistance to a sulfuric acid/hydrogen peroxide mixture can also be improved. Sulfuric acid/hydrogen peroxide mixture is used for removing a resist film to be described later, cleaning the reflective mask 2, or the like. Furthermore, by using Rh instead of Ru as the main component of the protection film 12, it is possible to suppress a decrease in reflectance with respect to EUV light.

The protection film 12 has a number of peaks Np of 50 or more in a luminance profile per 100 nm in the longitudinal direction of a gray scale image to be described later. Hereinafter, the number of peaks Np of the luminance profile per 100 nm in the longitudinal direction of the gray scale image will also be simply referred to as the number of peaks Np.

The gray scale image is obtained by imaging a cross section of the protection film 12 with a transmission electron microscope (TEM). The acceleration voltage of electrons in the TEM is, for example, 200 kV. The gray scale image has, for example, 256 gradations, a 2.5 million magnification, and 0.16 nm/pixel resolution.

Figure 5:
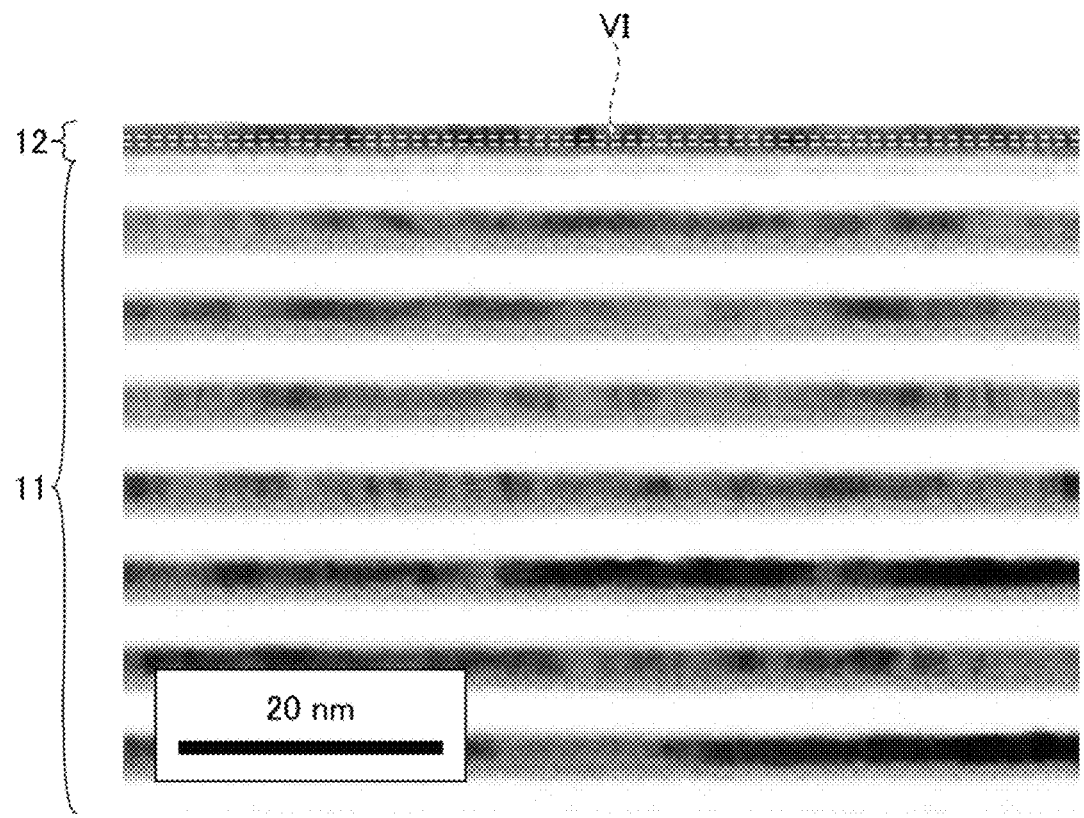
FIG. 5 is a view showing a TEM image of a multilayer reflective film and a protection film of Example 1 in TABLE 1.
Figure 5:
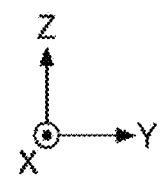
Figure 6:
FIG. 6 is an enlarged view of a region surrounded by a broken line VI in FIG. 5.
Figure 6:
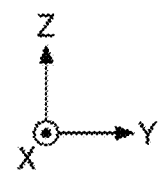

The gray scale image captured by the TEM may include a cross section of the multilayer reflective film 11 in addition to the cross section of the protection film 12, as shown in FIG. 5. The gray scale image (an image of a region surrounded by a broken line VI shown in FIG. 5) for creating a luminance profile has a band shape parallel to the interface between the protection film 12 and the multilayer reflective film 11, and is cut out on the center line in the thickness direction of the protection film 12.

The gray scale image that creates the luminance profile has a vertical size of 1 nm and a horizontal size of 74 nm. The vertical direction is a direction (Z-axis direction) perpendicular to the interface between the protection film 12 and the multilayer reflective film 11. The horizontal direction is a direction (Y-axis direction or X-axis direction) parallel to the interface between the protection film 12 and the multilayer reflective film 11. The horizontal size may be equal to or larger than 60 nm.

The luminance profile is created using a function called "Plot profile" of "ImageJ" (version 1.53e) distributed by the National Institutes of Health (NIH). ImageJ is an open source, and public domain image processing software.

The luminance of the luminance profile is output as a mean value within a region of 1 nm in the vertical direction. The luminance profile is smoothed by a polynomial approximation by the least squares method. Python 3 is used for the smoothing processing, and the method of Savitzky-Golay filter is used. The filter is represented in the Python code as follows:

savgol_filter(x,y,z)

x: luminance;

y: window_length (roughness of filter in smoothing); and z: polynomial_order (order of polynomial approximation used in smoothing).

The variable x represents all luminance in the luminance profile obtained from the TEM image in the horizontal direction. In the present processing, the value of y is 11, and the value of z is 5.

Figure 7:
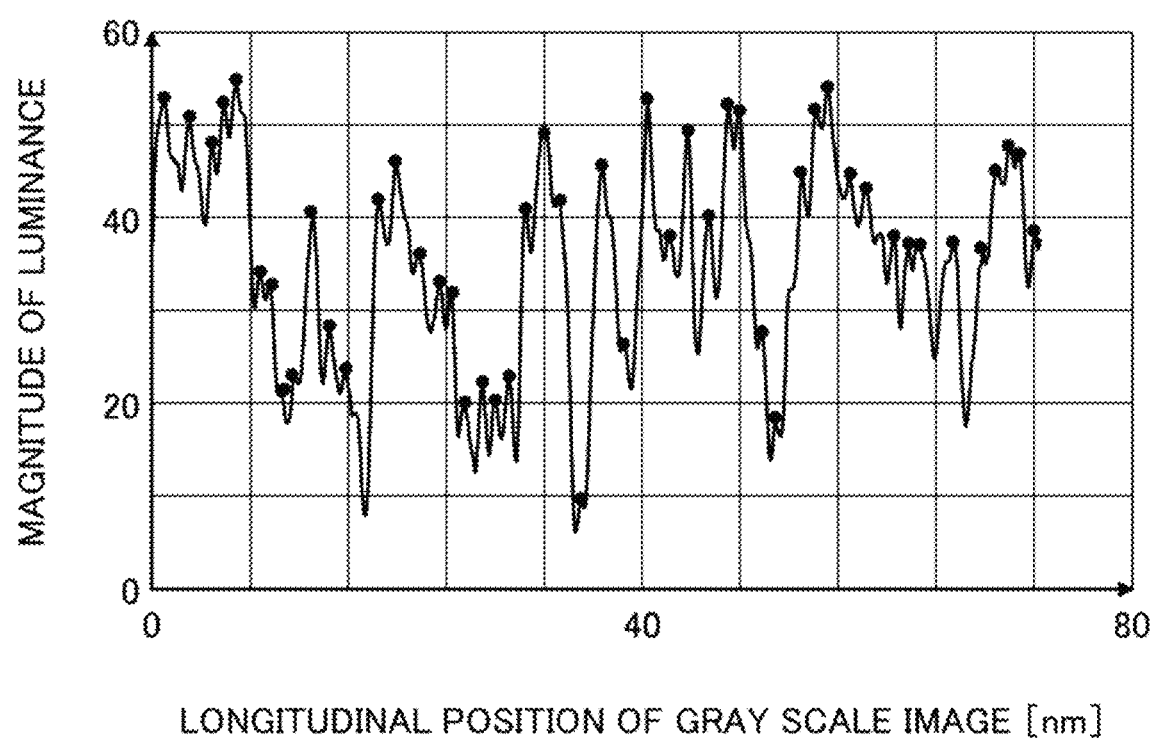
FIG. 7 is a diagram showing a luminance profile of FIG. 6.

FIG. 7 shows an example of a luminance profile after the smoothing. In FIG. 7, the horizontal axis represents the position in the longitudinal direction of the gray scale image, the vertical axis represents the magnitude of luminance, and the black circle represents the position of the peak. The peak of the luminance profile after the smoothing is detected by using the library of Python "scipy.signal.argrelmax". The order value of "signal.argrelmax" is set to 2.

The number of peaks Np is obtained by using the following formula (1):

$$Np = Np_0 \times (100/L_{X0}) \quad (1)$$

In the above formula (1), $Np_0$ is the number of peaks of the luminance profile, and $L_{X0}$ is the horizontal size (unit: nm) of the luminance profile. The $L_{X0}$ is, for example, 74 nm. $L_{X0}$ may be greater than or equal to 60 nm.

In the gray scale image captured by the TEM, the luminance of the image differs between the interior of the crystal and the crystal grain boundary. In the image, the crystal grain boundary is brighter than the interior of the crystal. As the protection film 12 is denser, the crystal grain size is smaller, the number of crystal grain boundaries is larger, and the number of peaks Np is larger. The denser the protection film 12, the better the etching resistance. Therefore, the larger the number of peaks Np, the better the etching resistance. The number of peaks Np is preferably 50 or more, and more preferably 55 or more. The number of peaks Np is preferably 120 or less, more preferably 100 or less.

According to the findings of the inventors of the present application, in the case where the main component of the protection film 12 is Rh, when the protection film 12 is formed by the ion beam sputtering method after forming the multilayer reflective film 11 by the magnetron sputtering method, the denseness of the protection film 12 is low, and the number of peaks Np becomes less than 50. In the case where the main component of the protection film 12 is Ru, the denseness of the protection film 12 is high and the number of peaks Np is 50 or more even when the protection film 12 is formed by the ion beam sputtering method after the multilayer reflective film 11 is formed by the magnetron sputtering method.

When the multilayer reflective film 11 and the protection film 12 are formed by different methods, a vacuum chamber used for forming the multilayer reflective film 11 and a vacuum chamber used for the forming of the protection film 12 are separately provided. Therefore, after the multilayer reflective film 11 is formed and before the protection film 12 is formed, the multilayer reflective film 11 is exposed to the atmosphere and the uppermost layer of the multilayer reflective film 11 is oxidized. The uppermost layer of the multilayer reflective film 11 is a layer in contact with the protection film 12 among the plurality of layers constituting the multilayer reflective film 11. In the case where the main Component of the protection film 12 is Rh, unlike the case where the main component of the protection film 12 is Ru, it is considered that when the uppermost layer of the multilayer reflective film 11 is oxidized, the denseness of the protection film 12 decreases.

Although described in detail in Examples, the inventors of the present application have found that even when the main component of the protection film 12 is Rh, the denseness of the protection film 12 can be improved by forming the multilayer reflective film 11 and the protection film 12 in this order in the same vacuum chamber. That is, the inventors of the present application have found that even when the main component of the protection film 12 is Rh, the denseness of the protection film 12 can be improved by suppressing the exposure of the multilayer reflective film 11 to the atmosphere and suppressing the oxidation of the uppermost layer of the multilayer reflective film 11.

The multilayer reflective film 11 preferably includes a Si film having a content of oxygen atoms of 15 at % or less as the uppermost layer in contact with the protection film 12. The content of oxygen atoms in the Si film which is the uppermost layer of the multilayer reflective film 11 is measured by, for example, TEM-EDX (Transmission Electron Microscopy Energy-Dispersive X-ray) Spectroscopy.

By forming the multilayer reflective film 11 and the protection film 12 in this order in the same vacuum chamber, oxidation of the Si film that is the uppermost layer of the multilayer reflective film 11 can be suppressed, and the oxygen content of the Si film that is the uppermost layer can be reduced to 15 at, or less. The oxygen content of the Si film as the uppermost layer is more preferably 10 at % or less, and still more preferably 5 at % or less.

During the formation of the protection film 12, the vacuum chamber is preferably controlled to 0.035 Pa or less. When the vacuum chamber is 0.035 Pa or less, the degree of vacuum is high and oxidation is suppressed. The vacuum chamber is more preferably 0.030 Pa or less. Also, the vacuum chamber may be 0.001 Pa or more.

Because the multilayer reflective film 11 and the protection film 12 are formed in the same vacuum chamber, they are formed by the same film forming method. As the film forming method, an ion beam sputtering method is preferable from the viewpoint of the degree of vacuum. According to the ion beam sputtering method, a vacuum chamber and a plasma source can be separated from each other, and the degree of vacuum of the vacuum chamber can be increased.

According to the findings of the invertors of the present application, for example, when the protection film is formed by the ion beam sputtering method, the number of peaks Np of the protection film 12 can be adjusted by adjusting the ion acceleration voltage. By decreasing the ion acceleration voltage, the energy of the sputtered particles decreases, the denseness of the protection film 12 increases, and the gas barrier property of the protection film 12 is improved. To be more specific, the number of peaks Np can be made 50 or more by setting the ion acceleration voltage to 400 V or more and 800 V or less.

According to the findings of the inventors of the present application, for example, when the protection film is formed by the ion beam sputtering method, the number of peaks Np of the protection film 12 can be adjusted by adjusting the gas pressure of the sputtering gas (for example, Ar). By adjusting the gas pressure of the sputtering gas, the energy of the sputtered particles decreases, and the denseness of the protection film 12 increases. Therefore, the number of peaks Np can be 50 or more. To be more specific, the number of peaks Np can be 50 or more by setting the gas pressure of the sputtering gas to 0.0050 Pa or more and 0.050 Pa or less.

The protection film 12 may contain only Rh as a metal element, or may contain at least one element X selected from Ru, Pd, Ir, Pt, Zr, Nb, Ta, and Ti in addition to Rh. The protection film 12 is formed of Rh alone or an Rh compound. The Rh compound contains Rh and X. Ru, Zr, Nb, and Ti can improve the reflectance for EUV light. Pd, Ir and Pt can improve the etching resistance. Ta can improve the resistance to hydrogen.

When the protection film 12 contains at least one element X selected from Ru, Pd, Ir, Pt, Zr, Nb, Ta, and Ti in addition to Rh as a metal element, the element ratio of Rh to X (Rh:X) is preferably 50:50 to 99:1. In the present specification, an element ratio means a molar ratio. The element ratio (Rh:X) is more preferably from 70:30 to 95:5.

The protection film 12 may contain at least one non-metal element selected from O, N, C, and B in addition to the metal element described above. The Rh compound constituting the protection film 12 may contain at least Rh and a non-metal element, and may further contain X. By adding the non-metal element to the metal element, crystallization of the protection film 12 can be suppressed, and the surface of the protection film 12 can be formed to be smooth. Therefore, the absorption film 13 and the like formed on the protection film 12 can be formed smoothly. In addition, the reflectance with respect to EUV light can be improved.

The thickness of the protection film 12 is preferably 1.5 nm or more and 4.0 nm or less, and more preferably 2.0 nm or more and 3.5 nm or less. When the thickness of the protection film 12 is 1.5 nm or more, the etching resistance is good. In addition, when the thickness of the protection film 12 is 4.0 nm or less, a decrease in the reflectance with respect to EUV light can be suppressed.

The film density of the protection film 12 is preferably 10.0 g/cm$^3$ or more and 14.0 g/cm$^3$ or less. When the film density of the protection film 12 is 10.0 g/cm$^3$ or more, the etching resistance is good. In addition, when the film density of the protection film 12 is 14.0 g/cm$^3$ or less, it is possible to suppress a decrease in reflectance with respect to EUV light.

The upper surface of the protection film 12, i.e., a surface of the protection film 12 on which the absorption film 13 is formed, preferably has a root mean square (RMS) roughness of 0.300 nm or less, more preferably 0.150 nm or less. When the root mean square (RMS) roughness is 0.300 nm or less, the absorption film 13 and the like can be smoothly formed on the protection film 12. In addition, scattering of the EUV light can be suppressed, and the reflectance with respect to EUV light can be improved. The root mean square (RMS) roughness is preferably 0.050 nm or more.

As shown in FIG. 4, the protection film 12 may be composed of a plurality of layers and may include, for example, a lower layer 12L and an upper layer 12U. The lower layer 12L and the upper layer 12U are formed in this order on the multilayer reflective film 11. That is, the lower layer 12L is provided between the upper layer 12U and the multilayer reflective film 11.

The upper layer 12U contains 50 at % or more and 100 at % or less of Rh. Since the main component of the upper layer 12U is Rh, the following effects (A) to (C) are obtained. (A) The etching resistance of the absorption film 13 can be improved. In particular, when an oxygen-based gas is used as the etching gas, the etching resistance of the protection film 12 can be improved. (B) Resistance to sulfuric acid/hydrogen peroxide mixture can be improved. (C) Reflectance with respect to EUV light can be improved.

The upper layer 12U may contain only Rh as a metal element, or may contain at least one element X selected from Ru, Pd, Ir, Pt, Zr, Nb, Ta, and Ti in addition to Rh. The upper layer 12U is formed of Rh alone or a Rh compound. The Rh compound contains Rh and X. The element ratio of Rh to X (Rh:X) in the upper layer 12U is preferably 99:1 to 1:1, and more preferably 70:30 to 95:5.

The upper layer 12U may contain at least one non-metal element selected from O, N, C, and B in addition to the metal elements described above. The Ph compound constituting the upper layer 12U may contain at least Rh and a non-metal element, and may further contain X. By adding the non-metal element to the metal element, crystallization of the protection film 12 can be suppressed, and the surface of the protection film 12 can be formed to be smooth. Therefore, the absorption film 13 and the like can be smoothly formed on the protection film 12. In addition, scattering of EUV light can be suppressed, and the reflectance with respect to EUV light can be improved.

The thickness of the upper layer 12U is preferably 0.1 nm or more and 4.0 nm or less, more preferably 0.2 nm or more and 3.5 nm or less, still more preferably 0.5 nm or more and 3.0 nm or less, and particularly preferably 1.0 nm or more and 2.5 nm or less. When the thickness of the upper layer 12U is 0.1 nm or more, the etching resistance is good. In addition, when the thickness of the upper layer 12U is 4.0 nm or less, it is possible to suppress a decrease in reflectance with respect to EUV light.

The lower layer 12L preferably contains 50 at % or more and 100 at % or less of Ru, Pd, Ir, Pt, Zr, Nb, Ta, or Ti. That is, the main component of the lower layer 12L is a metal element other than Rh, and is preferably Ru, Pd, Ir, Pt, Zr, Nb, Ta or Ti. That is, the lower layer 12L is formed of the above-described metal elements alone or a compound thereof. Ru, Zr, Nb, and Ti can improve the reflectance for EUV light. Pd, Ir, and Pt can improve the etching resistance of the protection film 12. Ta can improve the resistance to hydrogen. The main component of the lower layer 12L is more preferably Ru.

The lower layer 12L may contain at least one non-metal element selected from C, N, C, and B in addition to the metal elements described above. The metallic compound constituting the lower layer 12L may contain at least the above-described metal element and non-metal element.

The thickness of the lower layer 12L is preferably 0.5 nm or more and 2.0 nm or less, and more preferably 0.5 nm or more and 1.5 nm or less. When the thickness of the lower layer 12L is 0.5 nm or more, the material of the upper layer 12U can be prevented from diffusing into the multilayer reflective film 11. In addition, when the thickness of the lower layer 12L is 2.0 nm or less, it is possible to suppress a decrease in reflectance with respect to EUV light. The lower layer 12L containing a metal element other than Rh as a main component is preferably thinner than the upper layer 12U containing Ph as a main component. However, as long as the protection film 12 contains 50 at % or more of Rh as a whole, the lower layer 12L may be thicker than the upper layer 12U.

When the Ru film is formed as the lower layer 12L by using the ion beam sputtering method, an example of film formation conditions is as follows.

<Film Formation Condition for Ru Film (Lower Layer)>
Target: Ru target;
Sputtering gas: Ar gas;
Gas pressure: 0.010 Pa to 0.020 Pa;
Ion acceleration voltage: 300 V to 1500 V;
Film formation rate: 0.010 nm/sec to 0.100 nm/sec; and
Thickness of the Ru film: 0.5 nm to 2.0 nm.

When the Rh film is formed as the upper layer 12U by using the ion beam sputtering method, an example of film formation conditions is as follows.

<Film Formation Condition for Rh Film (Upper Layer)>
Target: Rh target;
Sputtering gas: Ar gas;
Gas pressure: 0.010 Pa to 0.035 Pa;
Ion acceleration voltage: 300 V to 1500 V;
Film formation rate: 0.010 nm/sec to 0.100 nm/sec; and
Thickness of the Rh film: 0.5 nm to 4.0 nm.

The absorption film 13 is a film in which the opening pattern 13a is formed. The opening pattern 13a is not formed in the manufacturing process of the reflective mask blank 1 but rather is formed in the manufacturing process of the reflective mask 2. The absorption film 13 may not only absorb EUV light but also shift a phase of the EUV light. That is, the absorption film 13 may be a phase shift film. The phase shift film shifts a phase of second EUV light L2 with respect to a phase of a first EUV light L1 shown in FIG. 3.

The first EUV light L1 is light that entered and passed through the opening pattern 13a without passing through the absorption film 13, was reflected by the multilayer reflective film 11, and passed through the opening pattern 13a again without passing through the absorption film 13 and exited. The second EUV light L2 is light that entered and passed through the absorption film 13 while being absorbed by the absorption film 13, was reflected by the multilayer reflective film 11, and passed through the absorption film 13 while being absorbed again by the absorption film 13 and exited.

The phase difference, which is greater than or equal to zero, between the first EUV light 11 and the second EUV light L2 is, for example, 170°-250°. A phase of the first EUV light L1 may be advanced or retarded from a phase of the second EUV light L2. The absorption film 13 improves a contrast of a transferred image by utilizing an interference between the first EUV light L1 and the second EUV light L2. The transferred image is an image obtained by transferring the opening pattern 13a of the absorption film 13 to a target substrate.

In EUVL, the so-called shadowing effect occurs. The shadowing effect is caused by an incident angle θ of EUV light that is not 0° (e.g. 6°), which causes a region near the side wall of the opening pattern 13a that blocks the EUV light by the side wall, resulting in a positional displacement or dimensional displacement of the transferred image. To reduce the shadowing effect, lowering the height of the side wall of the opening pattern 13a is effective, and thinning the absorption film 13 is effective.

A film thickness of the absorption film 13 is, for example, 60 nm or less, and preferably 50 nm or less, to reduce the shadowing effect. The film thickness of the absorption film 13 is preferably 20 nm or more, and more preferably 30 nm or more, to ensure the phase difference between the first EUV light L1 and the second EUV light L2.

The absorption film 13 preferably contains at least one metal element selected from Ru, Ta, Cr, Nb, Pt, Ir, Re, W, Mn, Au, Si and Al. Since these metal elements have relatively small refractive indices, the film thickness of the phase shift film can be reduced while ensuring the phase difference. The absorption film 13 preferably contains Ru among the above-described metal elements. The absorption film 13 is formed of the above-described metal element alone or a compound thereof.

The absorption film 13 contains at least one non-metal element selected from O, N, C, and B in addition to the above-described metal elements. The compound constituting the absorption film 13 may contain the above-described metal element and non-metal element. By adding the non-metal element to the metal element, it is possible to suppress the absorption film 13 from being crystallized and to reduce the roughness of the side wall of the opening pattern 13a. The absorption film 13 preferably contains oxygen as a non-metal element, and more preferably contains oxygen and nitrogen.

The refractive index n of the absorption film 13 is preferably 0.930 or less, more preferably 0.920 or less, still more preferably 0.910 or less, and particularly preferably 0.90 or less. The refractive index n is preferably 0.885 or more. In the specification of the present application, the refractive index is a refractive index to light with a wavelength of 1.3.5 nm.

The extinction coefficient k of the absorption film 13 is preferably 0.015 or more, and more preferably 0.020 or more. Further, the extinction coefficient k is preferably 0.065 or less. In the specification of the present application, the extinction coefficient is an extinction coefficient for light with a wavelength of 13.5 nm.

An etching rate of the absorption film 13 by sulfuric acid/hydrogen peroxide mixture is preferably 0 nm/min to 0.05 nm/min. When the etching rate of the absorption film 13 with sulfuric acid/hydrogen peroxide mixture is 0.05 nm/min or less, damage to the absorption film 13 during cleaning can be suppressed.

The film forming method of the absorption film 13 is, for example, a DC sputtering method, a magnetron sputtering method, an ion beam sputtering method, or a reactive sputtering method. An oxygen content of the absorption film 13 can be controlled by a content of $O_2$ gas in sputtering gas. A nitrogen content of the absorption film 13 can be controlled by a content of $N_2$ gas in the sputtering gas.

When a RuN film is formed as the absorption film 13 by the reactive sputtering method, an example of the film formation conditions is as follows.

<Film Formation Condition for RuN Film>
 Target: Ru target;
 Sputtering gas: mixture gas of Ar gas and $N_2$ gas;
 Volume ratio of $N_2$ gas in sputtering gas ($N_2/(Ar+N_2)$): 0.3 to 0.7;
 Gas pressure: 0.05 Pa to 0.40 Pa;
 Input power: 100 W to 300 W;
 Film formation rate: 0.010 nm/sec to 0.030 nm/sec; and
 Thickness: 20 nm to 60 nm.

The etching mask film 14 is formed on the absorption film 13 opposite to where the protection film 12 is provided, and is used to form the opening pattern 13a in the absorption film 13. A resist film (not shown) is provided on the etching mask film 14. In the manufacturing process of the reflective mask 2, a first opening pattern is formed on the resist film, then a second opening pattern is formed on the etching mask film 14 using the first opening pattern, and then a third opening pattern 13a is formed on the absorption film 13 using the second opening pattern. The first opening pattern, the second opening pattern, and the third opening pattern 13a have identical dimensions and identical shapes in a plan view (viewed along the Z-axis direction). The etching mask film 14 enables thinning of the resist film.

The etching mask film 14 preferably contains at least one metal element selected from Cr, Nb, Ti, Mo, Ta, and Si. The etching mask film 14 is formed of the above-described metal elements alone or a compound thereof. The etching mask film 14 may contain at least one non-metal element selected from O, N, C, and B in addition to the above-described metal elements. The compound constituting the etching mask film 14 may contain the above-described metal element and non-metal element.

The film thickness of the etching mask film 14 is preferably 2 nm or more and 30 nm or less, more preferably 2 nm or more and 25 nm or less, and still more preferably 2 nm or more and 10 nm or less.

The method of forming the etching mask film 14 is, for example, a DC sputtering method, a magnetron sputtering method, or an ion beam sputtering method.

Figure 8:
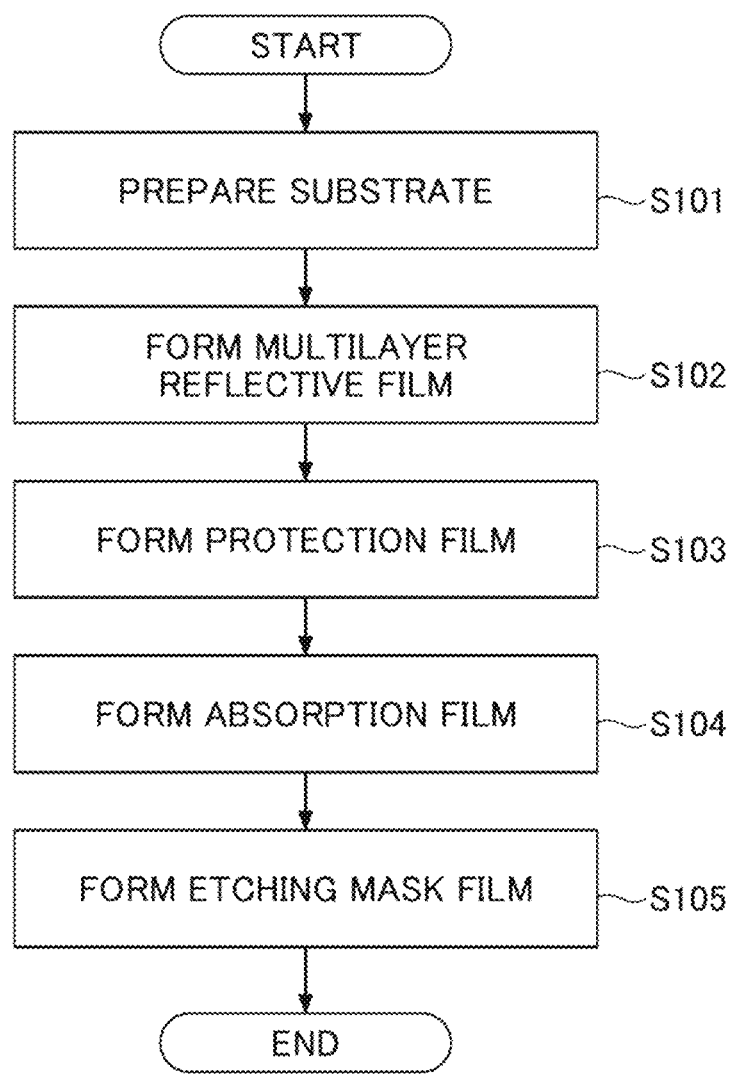
FIG. 8 is a flowchart showing a method of manufacturing a reflective mask blank according to the embodiment.

Next, a method of manufacturing the reflective mask blank 1 according to the embodiment of the present disclosure will be described with reference to FIG. 8. The method of manufacturing the reflective mask blank 1 includes, for example, steps S101 to 3105 shown in FIG. 8. The substrate 10 is prepared (step S101). A multilayer reflective film 11 is formed on a first main surface 10a of the substrate 10 (step 3102). A protection film 12 is formed on the multilayer reflective film 11 (step S103). An absorption film 13 is formed on the protection film 12 (step S104). An etching mask film 14 is formed on the absorption film 13 (step S105).

The method of manufacturing the reflective mask blank 1 is required to have at least steps S101 to S104. The method of manufacturing the reflective mask blank 1 may further include a step of forming a functional film not shown in FIG. 8.

Figure 9:
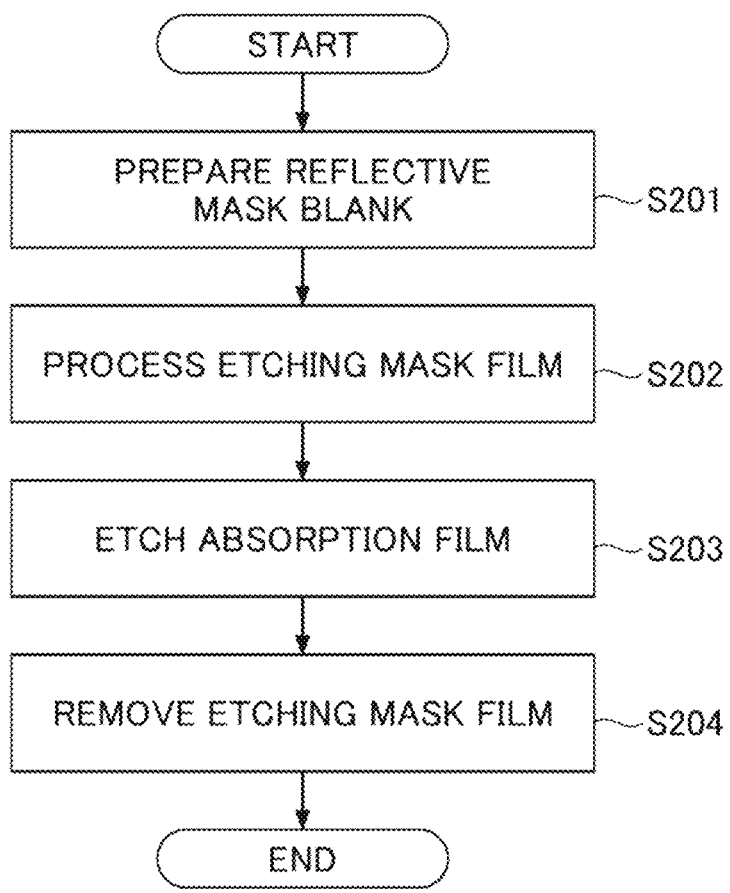
FIG. 9 is a flowchart showing a method of manufacturing a reflective mask according to the embodiment.

Next, a method of manufacturing the reflective mask 2 according to the embodiment of the present disclosure will be described with reference to FIG. 9. The method of manufacturing the reflective mask 2 has steps S201 to S204 shown in FIG. 9. A reflective mask blank 1 is prepared (step S201). An etching mask film 14 is processed (step S202). A resist film (not shown) is provided on the etching mask film 14. A first opening pattern is formed on the resist film, then a second opening pattern is formed on the etching mask film 14 using the first opening pattern. A third opening pattern 13a is formed on the absorption film 13 using the second opening pattern (step S203). In Step S203, the absorption film 13 is etched using an etching gas. The resist film and the etching mask film 14 are removed (step S204). The resist film is removed using, for example, sulfuric acid/hydrogen peroxide mixture. The etching mask film 14 is removed using, for example, etching gas. The etching gas used in step S204 (to remove the etching mask film 14) may be the same type as the etching gas used in step S203 (to etch the absorption film 13). The manufacturing method of the reflective mask 2 is required to have at least steps S201 and S203.

EXAMPLES

In the following, experimental data will be described. Examples 1 to 2 and 4 below are practical examples, and Examples 3 and 5 are comparative examples.

Example 1

In Example 1, a reflective mask blank including a substrate, a multilayer reflective film, a protection film, and an absorption film in this order was fabricated. As the substrate, a $SiO_2$—$TiO_2$-based glass substrate (outer shape: a square of 6 inches (152 mm) per side and 6.3 mm thick) was prepared. The glass substrate had a thermal expansion coefficient of $0.02 \times 10^{-7}/°$ C. at 20° C., a Young's modulus of 67 GPa, a Poisson's ratio of 0.17, and a specific stiffness of $3.07 \times 10^7$ $m^2/s^2$. A quality-guaranteed region of a first major surface of the substrate had a root mean square (RMS) roughness of less than or equal to 0.150 nm and a flatness of less than or equal to 100 nm by polishing. A Cr film with a thickness of 100 nm was formed on the second main surface of the substrate by the magnetron sputtering method. The sheet resistance of the Cr film was 100Ω/□.

As the multilayer reflective film, a Mo/Si multilayer reflective film was formed. The Mo/Si multilayer reflective film was formed by repeating 40 times the formation of a Si film (film thickness was 4.5 nm) and a Mo film (film thickness was 2.3 nm) using the ion beam sputtering method. The total film thickness of the Mo/Si multilayer reflective film was 272 nm ((4.5 nm+2.3 nm)×40). As the uppermost layer, a Si film was used to prevent oxidation of the Mo film. In general, a Mo film is more easily oxidized than a Si film.

The film formation conditions for the Si film and the Mo film were as follows.
<Film Formation Condition for Si Film>
 Target: Si target (boron-doped);
 Sputtering gas: Ar gas;
 Gas pressure: 0.020 Pa;
 Ion acceleration voltage: 700V;
 Film formation rate: 0.077 nm/sec; and
 Thickness: 4.5 nm.
<Film Formation Condition for Mo Film>
 Target: Mo target;
 Sputtering gas: Ar gas;
 Gas pressure: 0.020 Pa;
 Ion acceleration voltage: 700 V;
 Film formation rate: 0.064 nm/sec; and
 Thickness: 2.3 nm.

As the protection film, a Rh film (single layer) was formed. The Ph film was formed using an ion beam sputtering method. The multilayer reflective film and the protection film were formed in this order in the same vacuum chamber. After the formation of the multilayer reflective film and before the formation of the protection film, the multilayer reflective film was not exposed to the atmosphere and the uppermost layer of the multilayer reflective film was not oxidized. The film formation conditions for the Ph film were as follows.
<Film Formation Condition for Rh Film (Single Layer)>
 Target: Rh target;
 Sputtering gas: Ar gas;
 Gas pressure: 0.027 Pa;
 Ion acceleration voltage: 600 V;
 Film formation rate: 0.077 nm/sec; and
 Thickness: 3.0 nm.

As the absorption film, a RuN film (thickness: 39 nm) was formed. The RuN film was formed using the reactive sputtering method. The film formation conditions for the RuN film were as follows.
<Film Formation Condition for RuN Film>
 Target: Ru target;
 Sputtering gas: mixture gas of Ar gas and $N_2$ gas;
 Volume ratio of $N_2$ gas in sputtering gas ($N_2/(Ar+N_2)$): 0.5;
 Gas pressure: 0.20 Pa;
 Input power: 200 W;
 Film formation rate: 0.017 nm/sec; and
 Thickness: 39 nm.

A reflective mask blank was obtained by the above procedure. The oxygen content of the Si film which is the uppermost layer of multilayer reflective film, the peak number Np of the protection film, and the etching resistance of the protection film were measured in the state before the absorption film was formed.

The oxygen content of the Si film as the uppermost layer of the multilayer reflective film was measured by using TEM-EDX (manufactured by JEOL Ltd., trade name: ARM200F) before performing the following etching test. The lower limit of measurement was 4 at %.

The number of peaks Np of the protection film was measured using TEM (manufactured by JEOL Ltd., trade name: ARM200F) before performing the following etching test. The measurement procedure was as described above. It is considered that the larger the number of peaks Np is, the denser the protection film is.

The etching test was performed using an inductively coupled plasma (ICP) etching apparatus. Specifically, the etching conditions were as follows.
<Etching Conditions>
 ICP antenna bias: 200 W;
 Substrate bias: 550 W;
 Etching time: 15 sec;
 Trigger pressure: $3.5 \times 10^2$ Pa;
 Etching pressure: $3.0 \times 10^{-1}$ Pa;
 Etching gas: mixture gas of $Cl_2$ gas and $O_2$ gas; and
 Gas flow rate ($Cl_2$ gas/$O_2$ gas): 10 sccm/10 sccm.

The etching resistance of the protection film was evaluated by the amount of permeation of etching gas, i.e., the increased amount of chlorine atoms or oxygen atoms in the multilayer reflective film.

Before the etching test, the multilayer reflective film does not contain chlorine atoms. Therefore, after the etching test, a line profile of the content (unit: at %) of chlorine atoms in the depth direction (Z-axis negative direction in FIG. 5) was obtained using TEM-EDX, and the maximum value $T_{Clmax}$ of the line profile was obtained. As the $T_{Clmax}$ is smaller, chlorine atoms are less likely to pass through the protection film and the etching resistance of the protection film is better.

Before the etching test, the multilayer reflective film may contain oxygen atoms. The multilayer reflective film may be oxidized during film formation. Therefore, before and after the etching test, line profiles of the content (unit: at %) of oxygen atoms in the depth direction (Z-axis negative direction in FIG. 5) were obtained respectively using TEM-EDX. The maximum value $T_{Omax}$ of the difference (positive value) between the line profile before the test and the line profile after the test was obtained. As $T_{Omax}$ is smaller, oxygen atoms are less likely to pass through the protection film, and the etching resistance of the protection film is better.

Example 2

In Example 2, an EUV mask blank was prepared under the same conditions as in Example 1 except that a Ru film (lower layer) and a Rh film (upper layer) were formed as protection films under the following conditions. The multilayer reflective film and the protection film were formed in this order in the same vacuum chamber. After the formation of the multilayer reflective film and before the formation of the protection film, the multilayer reflective film was not exposed to the atmosphere and the uppermost layer of the multilayer reflective film was not oxidized. In Example 2, the number of peaks Np of the protection film and the etching resistance of the protection film were measured in the same manner as in Example 1.

<Film Formation Condition for Ru Film (Lower Layer)>
  Target: Ru target;
  Sputtering gas: Ar gas;
  Gas pressure: 0.027 Pa;
  Ion acceleration voltage: 600 V;
  Film formation rate: 0.056 nm/sec; and
  Thickness: 1.0 nm.
<Film Formation Condition for Rh Film (Upper Layer)>
  Target: Rh target;
  Sputtering gas: Ar gas;
  Gas pressure: 0.027 Pa;
  Ion acceleration voltage: 600 V;
  Film formation rate: 0.077 nm/sec; and
  Thickness: 1.5 nm.

Example 3

In Example 3, an EUV mask blank was prepared under the same conditions as in Example 1 except that a Rh film (single layer) was formed as the protection film under the following conditions. The Rh film was formed by a DC magnetron sputtering method. Therefore, the multilayer reflective film and the protection film were formed in different vacuum chambers. After the formation of the multilayer reflective film and before the formation of the protection film, the multilayer reflective film was exposed to the atmosphere to oxidize the uppermost layer of the multilayer reflective film. In Example 3, the number of peaks Np of the protection film and the etching resistance of the protection film were measured in the same manner as in Example 1.

<Film Formation Condition for Rh Film (Single Layer)>
  Target: Rh target;
  Sputtering gas: Ar gas;
  Gas pressure: 0.130 Pa;
  Input power: 300 W;
  Film formation rate: 0.090 nm/sec; and
  Thickness: 2.5 nm.

Example 4

In Example 4, a Rh film (single layer) was formed as the protection film. An EUV mask blank was prepared under the same conditions as in Example 1 except for the thickness of the Rh film (single layer). The multilayer reflective film and the protection film were formed in this order in the same vacuum chamber. After the formation of the multilayer reflective film and before the formation of the protection film, the multilayer reflective film was not exposed to the atmosphere and the uppermost layer of the multilayer reflective film was not oxidized. In Example 4, the number of peaks Np of the protection film and the etching resistance of the protection film were measured in the same manner as in Example 1.

<Film Formation Condition for Rh Film (Single Layer)>
  Target: Rh target;
  Sputtering gas: Ar gas;
  Gas pressure: 0.027 Pa;
  Ion acceleration voltage: 600 V;
  Film formation rate: 0.077 nm/sec; and
  Thickness: 2.5 nm.

Example 5

In Example 5, an EUV mask blank was prepared under the same conditions as in Example 1 except that a Ru film (lower layer) and a Rh film (upper layer) were formed as protection films under the following conditions. The multilayer reflective film and the protection film were formed in this order in a vacuum chamber. After the formation of the multilayer reflective film and before the formation of the Ru film (lower layer) serving as the protection film, the multilayer reflective film was not exposed to the atmosphere. After the formation of the Fu film (lower layer), the Ru film (lower layer) was exposed to the atmosphere, and the uppermost layer of the multilayer reflective film was oxidized. After the exposure to the atmosphere, a Rh film (upper layer) was formed on the Ru film (lower layer). In Example 5, the number of peaks Np of the protection film and the etching resistance of the protection film were measured in the same manner as in Example 1.

<Film Formation Condition for Ru Film (Lower Layer)>
  Target: Ru target;
  Sputtering gas: Ar gas;
  Gas pressure: 0.027 Pa;
  Ion acceleration voltage: 600 V;
  Film formation rate: 0.056 nm/sec; and
  Thickness: 1.0 nm.
<Film Formation Condition for Rh Film (Upper Layer)>
  Target: Rh target;
  Sputtering gas: Ar gas;
  Gas pressure: 0.027 Pa;
  Ion acceleration voltage: 600 V;
  Film formation rate: 0.077 nm/sec; and
  Thickness: 2.0 nm.

[Results]

TABLE 1 shows the results of Examples 1 to 5.

TABLE 1

| | Multilayer reflective film | | Protection film | | | | | | |
|---|---|---|---|---|---|---|---|---|---|
| | | Oxygen content of uppermost layer [at %] | | | Film thickness [nm] | Film density [g/cm³] | Np [No. of peaks] | RMS roughness [nm] | $T_{Clmax}$ [at %] | $T_{Omax}$ [at %] |
| | Exposure to atmosphere | | Number of layers | Configuration | | | | | | |
| Ex. 1 | NO | 4.0 | 1 | Rh (single layer) | 3.0 | 12.18 | 66 | 0.111 | 1.4 | 0.3 |
| Ex. 2 | NO | 4.0 | 2 | Rh (upper layer) Ru (lower layer) | 2.5 | — | 56 | 0.111 | 2.9 | 1.5 |
| Ex. 3 | YES | 19.5 | 1 | Rh (single layer) | 2.5 | 12.23 | 31 | 0.156 | 5.4 | 26.7 |
| Ex. 4 | NO | 6.1 | 1 | Rh (single layer) | 2.5 | 12.10 | 73 | — | 0.8 | 0.0 |
| Ex. 5 | NO | 15.6 | 2 | Rh (upper layer) Ru (lower layer) | 3.0 | — | 43 | — | 5.2 | 6.6 |

As shown in TABLE 1, in Examples 1, 2, and 4, unlike in Examples 3 and 5, since the multilayer reflective film and the protection film were successively formed without being exposed to the atmosphere, the Si film as the uppermost layer of the multilayer reflective film was not oxidized, and the oxygen content of the Si film was 15 at % or less. In Examples 1, 2, and 4, unlike Examples 3 and 5, the number of peaks Np of the protection film was 50 or more, and $T_{Clmax}$ and $T_{Omax}$ were smaller than those in Example 3. Furthermore, in Examples 1 and 2, the root mean square roughness RMS of the surface of the protection film was smaller than that in Example 3.

As described above, the reflective mask blank, the reflective mask, the method of manufacturing the reflective mask blank, and the method of manufacturing the reflective mask according to the present disclosure have been described. However, the present disclosure is not limited to the above-described embodiments, and the like. Various variations, modifications, substitutions, additions, deletions, and combinations are possible within the scope of claims. They also of course fall within the technical scope of the present disclosure.

What is claimed is:

1. A reflective r cask blank rising:
   a substrate;
   a multilayer reflective film that reflects EUV light;
   a protection film that protects the multilayer reflective film; and
   an absorption film that absorbs the EUV light, the substrate, the multilayer reflective film, the protect on film, and the absorption film being arranged in this order, wherein
   the protection film contains 50 at % or more of Rh, and when a hand-shaped gray scale image parallel to an interface between the protection film and the multilayer reflective film is obtained by imaging a cross section of the protection film with a transmission electron microscope (TEM) and a luminance profile of the gray scale image in a longitudinal direction of the gray scale image is created, a number of peaks of the luminance profile per 100 nm in the longitudinal direction of the gray scale image is 50 or more.

2. The reflective mask blank according to claim 1, wherein,
   the multilayer reflective film includes a Si film having a content of oxygen atoms of 15 at % or less as an uppermost layer in contact with the protection film.

3. The reflective mask blank according to claim 1, wherein
   the protection film contains, as a metal element, only Rh, or contains, as metal elements, Rh and an element selected from the group consisting of Ru, Pd, Ir, Pt, Zr, Nb, Ta, and Ti.

4. The reflective mask blank according to claim 1, wherein
   the protection film contains, as metal elements, Rh and an element X, selected from the group consisting of Ru, Pd, Ir, Pt, Zr, Nb, Ta, and Ti in addition to Rh, and
   an element ratio of Rh to X (Rh:X) in the protection film is 50:50 to 99:1.

5. The reflective mask blank according to claim 1, wherein
   the protection film includes an upper layer containing 50 at % or more of Rh, and a lower layer containing 50 at % or more of Ru, Pd, Ir, Pt, Zr, Nb, Ta, or Ti, and
   the lower layer is provided between the upper layer and the multilayer reflective film.

6. The reflective mask blank according to claim 5, wherein
   in the protection film, a thickness of the lower layer is 0.5 nm or more and 2.0 nm or less, and a thickness of the upper layer is 0.5 nm or more and 4.0 nm or less.

7. The reflective mask blank according to claim 1, wherein
   the protection film is composed of a single layer containing 50 at % or more of Rh.

8. The reflective mask blank according to claim 1, wherein
   a thickness of the protection film is 1.5 am or more and 4.0 am or less.

9. The reflective mask blank according to claim 1, wherein a film density of the protection film is 10.0 g/cm³ or more and 14.0 g/cm³ or less.

10. The reflective mask. blank according to claim 1, wherein
a root mean square (RMS) roughness of a surface of the protection film on which the absorption film is formed is 0.300 nm or less.

11. The reflective mask blank according to claim 1, wherein
the absorption film contains a metal element selected from the group consisting of Ru, Ta, Cr, Nb, Pt, Ir, Re, W, Mn, Au, Si, and Al.

12. The reflective mask according to claim 11, wherein
the absorption film further contains a non-metal element selected from the group consisting of O, N, C, and B.

13. The reflective mask blank according to claim 1 further comprising an etching mask film on the absorption film opposite to where the protection film is provided, wherein
the etching mask film contains a metal element selected from the group consisting of Cr Nb, Ti, Mo, Ta, and Si.

14. The reflective mask blank according to claim 13, wherein
the etching mask film further contains a non-metal element selected from the group consisting of O, N, C, and B.

15. A reflective mask comprising the reflective mask blank of claim 1, wherein
the absorption film includes an opening pattern.

16. A method of manufacturing the reflective mask blank of claim 1, comprising:
forming the multilayer reflective film and the protection film in this order in a same vacuum chamber.

17. The method of manufacturing a reflective mask blank according to claim 16 further comprising:
controlling the vacuum chamber to 0.035 Pa or less during the forming of the protection film.

18. A method of manufacturing a reflective mask comprising:
preparing the reflective mask blank of claim 1; and
forming an opening pattern in the absorption film.

* * * * *